United States Patent
Sato et al.

(10) Patent No.: US 12,553,150 B2
(45) Date of Patent: Feb. 17, 2026

(54) GALLIUM NITRIDE SINGLE CRYSTAL SUBSTRATE AND METHOD FOR PRODUCING THE SAME

(71) Applicant: SUMITOMO CHEMICAL COMPANY, LIMITED, Tokyo (JP)

(72) Inventors: Takashi Sato, Ibaraki (JP); Tetsuji Fujimoto, Ibaraki (JP); Toshio Kitamura, Ibaraki (JP); Masatomo Shibata, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 19/053,833

(22) Filed: Feb. 14, 2025

(65) Prior Publication Data

US 2025/0263867 A1 Aug. 21, 2025

(30) Foreign Application Priority Data

Feb. 16, 2024 (JP) ................. 2024-021691

(51) Int. Cl.
| | | |
|---|---|---|
| B32B 3/02 | (2006.01) | |
| B32B 3/00 | (2006.01) | |
| B32B 3/14 | (2006.01) | |
| B32B 3/18 | (2006.01) | |
| C30B 25/16 | (2006.01) | |
| C30B 25/20 | (2006.01) | |

(Continued)

(52) U.S. Cl.
CPC ............. *C30B 29/406* (2013.01); *B32B 3/00* (2013.01); *B32B 3/14* (2013.01); *B32B 3/18* (2013.01); *C30B 25/165* (2013.01); *C30B 25/20* (2013.01); *H01L 21/02389* (2013.01); *H01L 21/0254* (2013.01)

(58) Field of Classification Search
CPC .... B32B 3/02; B32B 3/14; B32B 3/18; B32B 3/30; B32B 3/263
See application file for complete search history.

(56) References Cited

U.S. PATENT DOCUMENTS

| | | | |
|---|---|---|---|
| 12,258,678 B2 * | 3/2025 | Sato | ...... C30B 29/406 |
| 2002/0197825 A1 | 12/2002 | Usui et al. | |
| 2010/0001376 A1 | 1/2010 | Takamizawa et al. | |

FOREIGN PATENT DOCUMENTS

| | | |
|---|---|---|
| JP | 2003-178984 A | 6/2003 |
| JP | 2008-156189 A | 7/2008 |

OTHER PUBLICATIONS

Hamachi et al., "Propagation of threading dislocations and effects of Burgers vectors in HVPE-grown GaN bulk crystals on Na-flux-grown GaN substrates", Jun. 10, 2021, Journal of Applied Physics; 20 pages.

(Continued)

*Primary Examiner* — Elizabeth E Mulvaney
(74) *Attorney, Agent, or Firm* — Rankin, Hill & Clark LLP

(57) ABSTRACT

There is provided a gallium nitride single crystal substrate, which is a gallium nitride single crystal substrate having a diameter of 50 mm or more, with a low-index crystal plane closest to a main surface being (0001), and in which Ge concentration in the substrate is $3\times10^{18}$ cm$^{-3}$ or more; and among peaks appearing in a histogram of diameters of etch pits during etching applied to the main surface with an alkaline etching solution, a first peak having a smallest diameter is a single peak having no shoulder.

7 Claims, 6 Drawing Sheets

(51) Int. Cl.
  *C30B 29/40*     (2006.01)
  *H01L 21/02*     (2006.01)

(56) References Cited

OTHER PUBLICATIONS

Oshima et al., "Properties of Ge-doped, high-quality bulk GaN crystals fabricated by hydride vapor phase epitaxy", 2010, Journal of Crystal Growth, pp. 3569-3573.

* cited by examiner

GALLIUM NITRIDE SINGLE CRYSTAL SUBSTRATE AND METHOD FOR PRODUCING THE SAME

TECHNICAL FIELD

The present invention relates to a gallium nitride single crystal substrate and a method for producing the same.

DESCRIPTION OF RELATED ART

Group III nitride semiconductors, typified by gallium nitride (GaN), are widely used as materials for forming semiconductor devices, such as light-emitting devices and electronic devices. In order to improve the quality (semiconductor properties, etc.) of the semiconductor devices constituted by group III nitride semiconductors, it is desirable to produce semiconductor stacks or nitride semiconductor free-standing substrates used for semiconductor devices, with good crystal quality.

Further for example, patent document 1 discloses a method for producing a gallium nitride single crystal substrate by a VAS (Void-Assisted Separation) method, as a method for producing a GaN single crystal substrate. Also, patent document 2 discloses a method including the steps of epitaxially growing a semiconductor layer composed of GaN on a substrate, slicing the GaN layer, thereby fabricating a GaN free-standing substrate.

The GaN substrate that is intentionally doped with impurities to make it conductive is required to have low resistivity. Particularly, in recent years, there has been a demand for reducing the resistivity of an n-type GaN substrate used for high-power laser diodes and power devices. Conventionally, silicon (Si)-doped crystal has often been used for the n-type GaN substrate. However, it has been found that when it is attempted to dope the GaN substrate with a large amount of Si to further reduce the resistivity of the substrate, the crystallinity of GaN is deteriorated when the Si concentration in the crystal exceeds about $3 \times 10^{18}$ cm$^{-3}$. Therefore, the use of crystals doped with germanium (Ge) instead of Si is being considered. In the case of Ge, even when doped at more than $3 \times 10^{18}$ cm$^{-3}$, the crystallinity of GaN is hardly deteriorated (for example, non-patent document 1).

[Patent document 1] JP 2003-178984 A
[Patent document 2] JP 2008-156189 A
[Non-patent document 1] Y. Oshima, et al., J. Cryst. Growth 312 (2010) 3569

However, it has become clear that the GaN substrate doped with a high concentration of Ge has a problem in that a Ge concentration distribution in the plane of the substrate varies greatly, as described below.

SUMMARY OF THE INVENTION

An object of the present invention is to provide a gallium nitride single crystal substrate that is highly and uniformly doped with Ge.

According to one aspect of the present disclosure, there is provided a gallium nitride single crystal substrate,
which is a gallium nitride single crystal substrate having a diameter of 50 mm or more, with a low-index crystal plane closest to a main surface being (0001), and
in which Ge concentration in the substrate is $3 \times 10^{18}$ cm$^{-3}$ or more; and
among peaks appearing in a histogram of diameters of etch pits during etching applied to the main surface with an alkaline etching solution, a first peak having a smallest diameter is a single peak having no shoulder.

Further, according to another aspect of the present disclosure, there is provided a method for producing a gallium nitride single crystal substrate, the method including the steps of:
(a) preparing a base substrate composed of a gallium nitride single crystal having (0001) that is a low-index crystal plane closest to a main surface;
(b) epitaxially growing a gallium nitride single crystal having a Ge concentration of $3 \times 10^{18}$ cm$^{-3}$ or more on the main surface of the base substrate; and
(c) obtaining a gallium nitride single crystal substrate having a diameter of 50 mm or more from the gallium nitride single crystal epitaxially grown in the step (b), wherein in the step (b), a gas containing HCl is intermittently introduced to periodically etch a growth interface, thereby uniformly doping crystal with Ge.

According to the present disclosure, a gallium nitride single crystal substrate uniformly doped with Ge at a high concentration, can be provided.

DETAILED DESCRIPTION OF THE INVENTION

Figure 1:
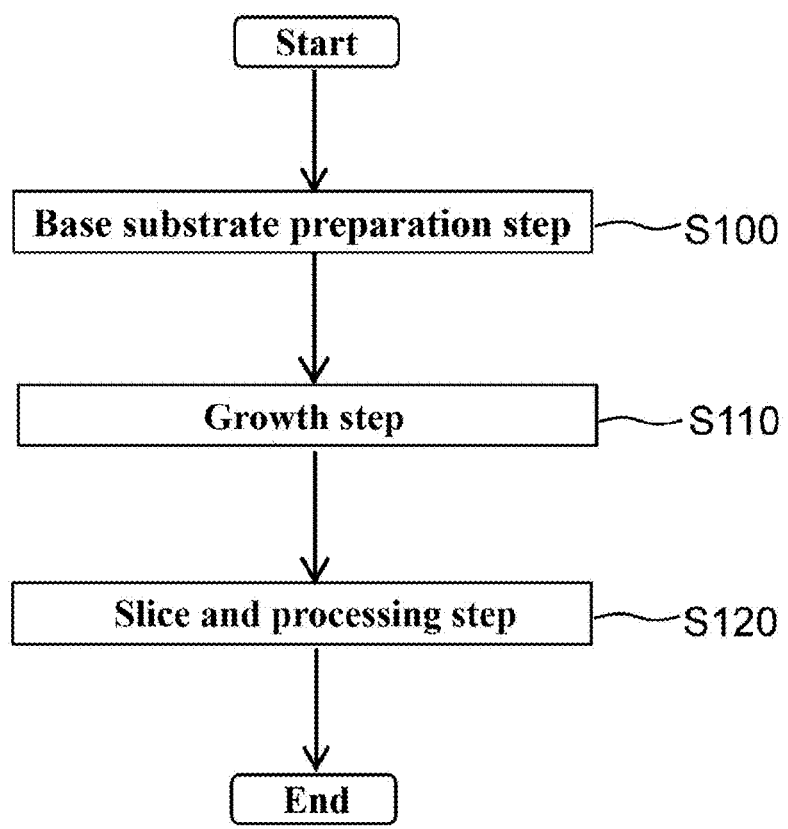
FIG. 1 is a flowchart illustrating a method for producing a gallium nitride single crystal substrate according to one embodiment of the present invention.

<Findings Obtained by the Inventors>
First, the findings obtained by the inventors will be described.

After repeated experiment of growing Ge-doped GaN crystal, the inventors have found that the GaN crystal can indeed be doped with Ge at a higher concentration than Si, and that GaN can be grown as a single crystal even when doped at, for example, $1 \times 10^{19}$ cm$^{-3}$ or more, but when the Ge doping amount becomes high, there is a phenomenon in which a peculiar defect occurs that causes a variation in the performance of the device fabricated on the substrate.

Further, the inventors investigated a size distribution of etch pits corresponding to dislocations obtained by etching the c-plane of a Ge-doped GaN substrate with an alkaline etching solution, and found that a unique feature appeared in the histogram of etch pit sizes corresponding to dislocations in Ge-rich regions. That is, it was found that in histograms of several types of etch pits of different sizes detected by etching, the peak of the smallest etch pit has a shoulder or a double peak. This is considered to be because in regions where Ge is locally concentrated, Ge is trapped at a dislocation core and diffuses abnormally over the dislocation core, resulting in the formation of Ge clusters and precipitates, which expand a strain field around the dislocation core and affect the size of the etch pit.

Then, it has become clear that the cause of the above-described variation in the device performance is correlated with the generation of strain fields around the dislocation core due to the generation of Ge clusters and precipitates.

According to the above-described model, it is predicted that Ge clusters and precipitates are more likely to occur, because as the amount of Ge incorporated into the crystal increases and as the dislocation density in the crystal decreases, Ge clusters and precipitates are more likely to accumulate on each dislocation core. However, in order to reduce the resistivity of the GaN substrate, it is desirable to dope as much Ge as possible, and also to minimize the density of dislocations, which are crystal defects. In order to suppress the occurrence of Ge clusters and precipitates while satisfying these demands, it is necessary to perform doping at a high concentration to a limit where Ge clusters and precipitates do not occur while preventing the variation in the Ge concentration in the crystal.

Here, Ge is easily incorporated unevenly into the growing crystal, and particularly, when a large-diameter GaN substrate exceeding 50 mm in diameter is produced, Ge concentration is likely to be locally high in the plane of the substrate. This is because, compared to Si, the amount of Ge incorporated into the crystal is easily changed depending on the inclination of a crystal plane orientation at a crystal growth interface, and it is found that when a morphology having a slight inclination plane corresponding to a facet growth region appears at the crystal growth interface, the amount of Ge incorporated into that region increases. Therefore, in the case of doping with Ge at a high concentration, concentration unevenness is likely to occur in such a manner as exceeding a threshold value at which Ge clusters and precipitates occur, and in the case of growth on a large-diameter substrate having a large growth interface area, a large facet surface is likely to be formed, and therefore a highly uneven morphology is formed, which more likely to form a high concentration area.

The threshold value of Ge concentration that causes Ge clusters and precipitates to occur, depends not only on the concentration of Ge incorporated into the crystal, but also on various factors such as the density and type of dislocations present in that region, crystal growth temperature and pressure, concentrations of other impurities and point defects in the crystal, and the degree of residual stress, and therefore it is difficult to generally determine the threshold value of Ge.

However, based on the above findings, whether or not Ge clusters or precipitates have occurred, can be determined by observing whether or not the first peak in the histogram of etch pit sizes is a single peak without a shoulder. That is, the histogram of etch pit sizes can be used as a guideline to measure the uniformity of the Ge distribution.

The etch pit size also depends greatly on etching conditions. Therefore, it is meaningless to discuss the absolute value of the etch pit size. However, among various types of the etch pits of different sizes detected by etching, the smallest etch pit is highly likely to correspond to an edge dislocation having a smallest strain field around the dislocation core. Therefore, the inventors examined a histogram of etch pit diameters, normalized the diameter of the smallest peak among the peaks appearing in the histogram as a standard, and examined the diameters and numbers of other etch pits. This technique is of great value in investigating the distribution of dislocation types and dislocation-related properties in the gallium nitride single crystal substrate.

It is very difficult to confirm local unevenness in the Ge concentration in the GaN crystal. However, according to the technique of the present invention, by creating the histogram of etch pit diameters in a relatively large area (e.g., 1 mm$^2$ or more), the unevenness of the Ge concentration can be confirmed.

Further, the inventors have conducted extensive research into a method for producing a substrate that can provide the above-described histogram, that is, a gallium nitride single crystal substrate that is uniformly and highly doped with Ge. The variation that occurs in the manner of Ge incorporation into the GaN crystal is because an inclined surface occurs at the growth interface during crystal growth due to facet growth. The facet growth that occurs at the growth interface is considered to be because variations occur in the density of atomic steps formed due to defects such as dislocations and in the concentration of impurities remaining due to interface segregation. Therefore, the inventors achieve a technique of uniformly doping the GaN crystal with Ge as follows: in the step of growing the Ge-doped GaN layer, a gas containing HCl is intermittently introduced to the growth interface, and the growing crystal plane is periodically etched to maintain the flatness and cleanliness of the interface, thereby suppressing the formation of tiny facets that serve as a precursor to facet growth at the growth interface, thus achieving a uniform Ge doping into GaN crystal.

<One Embodiment of the Present Invention>

Hereinafter, one embodiment of the present invention will be described with reference to the drawings.

Hereinafter, in a GaN crystal having a wurtzite structure, <0001> axis is referred to as "c-axis" and (0001) is referred to as "c-plane". (0001) is sometimes referred to as "+c plane (gallium polar plane)" and (000-1) is sometimes referred to as "−c plane (nitrogen (N) polar plane)." Further, <1-100> axis is referred to as "m-axis" and {1-100} is referred to as "m-plane." The m-axis may also be written as <10-10> axis. Further, <11-20> axis is referred to as "a-axis" and {11-20} is referred to as "a-plane".

(1) Method for Producing a Gallium Nitride Single Crystal Substrate

Figure 2A:
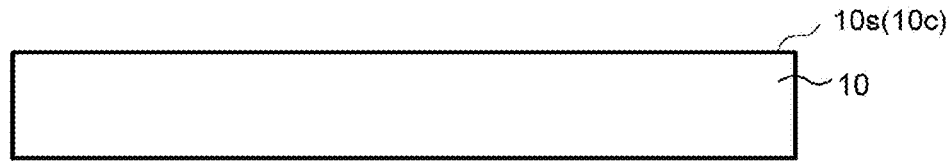
FIG. 2A is a schematic cross-sectional view illustrating a part of a method for producing a gallium nitride single crystal substrate according to one embodiment of the present invention.
Figure 2B:
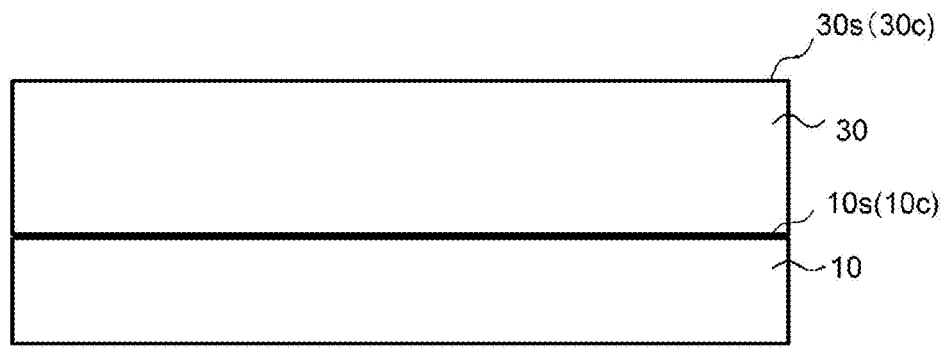
FIG. 2B is a schematic cross-sectional view illustrating a part of a method for producing a gallium nitride single crystal substrate according to one embodiment of the present invention.
Figure 2C:
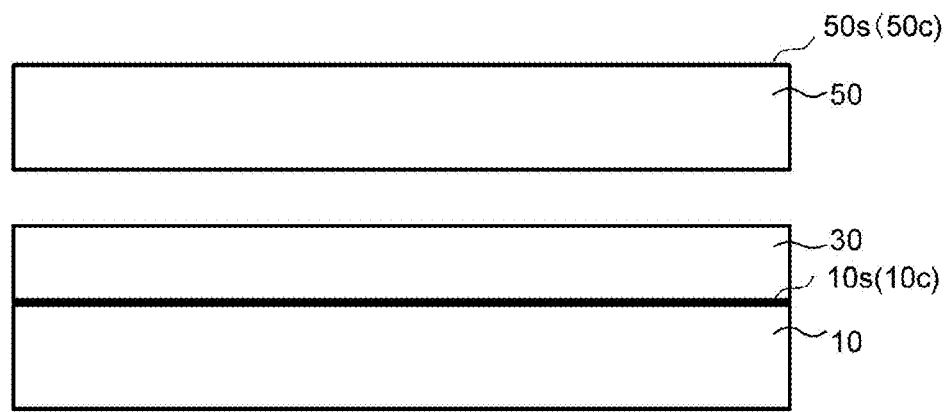
FIG. 2C is a schematic cross-sectional view illustrating a part of a method for producing a gallium nitride single crystal substrate according to one embodiment of the present invention.

The method for producing a gallium nitride single crystal substrate according to this embodiment will be described with reference to FIG. 1 and FIGS. 2A to 2C. FIG. 1 is a flowchart illustrating a method for producing a gallium nitride single crystal substrate according to this embodiment. FIGS. 2A to 2C are schematic cross-sectional views illustrating a part of the method for producing a gallium nitride single crystal substrate according to this embodiment.

As illustrated in FIG. 1, the method for producing a gallium nitride single crystal substrate according to this embodiment includes, for example, a base substrate preparation step S100, a growth step S110, and a slicing and machining step S120.

(S100: Base Substrate Preparation Step)

As illustrated in FIG. 2A, in the base substrate preparation step S100, a base substrate 10 is prepared, which is composed of gallium nitride single crystal and in which a low-index crystal plane closest to a main surface 10s is (0001) (c-plane 10c). Specifically, a commercially available gallium nitride single crystal substrate (not a template, but a free-standing substrate) may be used as the base substrate 10, or the base substrate 10 composed of gallium nitride single crystal may be fabricated by the VAS (Void-Assisted Separation) method described in Patent document 1. The base substrate 10 may be Ge-doped, Si-doped, or undoped, but is preferably Ge-doped. Thereby, the difference in Ge concentration between the base substrate 10 and a growth layer 30 (described later) can be reduced.

(S110: Growth Step)

In the growth step S110, on the main surface 10s of the base substrate 10 prepared in the base substrate preparation step S100, a single crystal of GaN is epitaxially grown with, for example, the c-plane 30c as a growth plane, as illustrated in FIG. 2B. Specifically, for example, by supplying GaCl gas and $NH_3$ gas to the heated base substrate 10 by the HVPE method, epitaxial growth is caused directly on the main surface 10s of the base substrate 10 to grow a growth layer 30.

In the growth step S110, for example, the growth layer 30 is grown under a predetermined growth condition. As a growth condition in this embodiment, for example, the growth temperature is preferably set to, for example, 980° C. or more and 1200° C. or less. Further, in the growth step S110, the ratio of the supply rate of $NH_3$ gas as a nitriding gas to the supply rate of GaCl gas as a group III source gas (hereinafter also referred to as the "V/III ratio") is preferably set to, for example, 0.1 or more and 5.0 or less.

In the growth step S110, GaCl gas, $NH_3$ gas, and an n-type dopant gas, for example, tetrachlorogermane ($GeCl_4$) gas, are supplied to the base substrate 10. Thereby, the GaN layer doped with high concentration of Ge, that is, the GaN layer having a Ge concentration of $3\times10^{18}$ $cm^{-3}$ or more and $1\times10^{20}$ $cm^{-3}$ or less, is epitaxially grown. The $GeCl_4$ gas is supplied, for example, from a cylinder, or supplied as follows: a source container is placed in a thermostatic chamber maintained at about 5° C. and $GeCl_4$ is liquefied and bubbled using a carrier gas. The carrier gas may be either $H_2$ gas or $N_2$ gas, or both. In either case, it is preferable to control a flow rate so that a partial pressure of the $GeCl_4$ gas is 0.3 to 30 Pa, using a mass flow controller.

Other growth conditions in the growth step S110 are, for example, as follows.

Growth pressure: 90 to 105 kPa, preferably 90 to 95 kPa
Partial pressure of GaCl gas: 1.5 to 15 kPa
Partial pressure of $GeCl_4$ gas: 0.3 to 30 Pa
$N_2$ gas flow rate/$H_2$ gas flow rate: 0 to 1

In the growth step S110, a gas containing HCl is intermittently introduced to periodically etch the growth interface (also called intermittent etching), thereby uniformly doping the crystal with Ge. Specifically, for example, during growth using the c-plane 30c as the growth plane, the supply of the GaN source gas and the n-type dopant gas is temporarily stopped, and HCl gas and a carrier gas (for example, $H_2$ gas) are introduced. This suppresses the formation of minute facets on the growth plane, and therefore uniform Ge doping can be achieved. The introduction of the gas containing HCl is preferably performed at intervals of, for example, 5 to 10 minutes, for 0.5 to 1 minute each time.

In the growth step S110, it is preferable that the thickness of the growth layer 30 is, for example, 1 mm or more and 20 mm or less. The c-plane warping that occurs in the base substrate 10 is inherited by the growth layer 30 grown thereon, and therefore due to the growth of the growth layer 30 to a certain thickness or more, stress is generated in the crystal to straighten the warping and flatten the c-plane, and the size of the c-plane warping becomes gradually small. If the thickness of the growth layer 30 is less than 1 mm, there is a possibility that a sufficient stress for straightening the c-plane warping cannot be obtained. Further, in the subsequent slicing and machining step S120, it is difficult to obtain a GaN single crystal substrate with a sufficient thickness. In contrast, by setting the thickness of the growth layer 30 to 1 mm or more, the c-plane warping can be small. Further, in the subsequent slicing and machining step S120, a GaN single crystal substrate with a sufficient thickness can be obtained. On the other hand, if the thickness of the growth layer 30 exceeds 20 mm, the force attempting to straighten the c-plane warping may cause excessive strain to accumulate in the crystal, leading to the proliferation of dislocations in the crystal or the generation of microcracks. Further, if the internal residual stress in the GaN crystal becomes large, crystal fracture is more likely to occur in the slicing and machining step S120. In contrast, by setting the thickness of the growth layer 30 to 20 mm or less, the internal residual stress of the GaN crystal can be reduced, and cracks and fractures can be suppressed. Further, by performing intermittent etching during Ge-doped growth, the impurity distribution becomes smaller, and the internal residual stress of the crystal becomes smaller. As a result, a thicker film can be grown than in the case where intermittent etching is not performed, and the radius of curvature of the c-plane can be further large.

(S120: Slicing and Machining Step)

In the slicing and machining step S120, as illustrated in FIG. 2C, for example, the growth layer 30 is sliced along a cutting plane approximately parallel to the main surface 30s (c-plane 30c) of the growth layer 30 using a wire saw, etc. Thereby, at least one gallium nitride single crystal substrate 50 (also referred to as a substrate 50) having a diameter of 50 mm or more is obtained as an as-sliced substrate. At this time, it is preferable to slice the substrate 50 so that the thickness thereof is, for example, 300 μm or more and 500 μm or less.

When the GaN substrate fabricated by the VAS method is used as the base substrate 10, the c-plane 50c of the base substrate 10 normally has a warping with a radius of curvature of about 5 m in a direction that makes the surface concave. The radius of curvature of the c-plane 50c of the substrate 50 cut out from the growth layer 30 is likely to be larger than the radius of curvature of the c-plane 10c of the base substrate 10. Specifically, the radius of curvature of the c-plane 50c of the substrate 50 is, for example, preferably 10 m or more, and more preferably 20 m or more. Thereby, the variation in the off-angle θ of the c-axis with respect to the normal on the main surface 50s of the substrate 50 (the maximum and minimum difference in the off-angle θ in the plane of the substrate) can be smaller than the variation in the off-angle of the c-axis of the base substrate 10.

Once the substrate 50 is obtained as an as-sliced substrate, both surfaces of the substrate 50 may be polished, for example, by a polishing device.

In this embodiment, the substrate 50 obtained in the slicing and processing step S120 may be used as a new base substrate 10, and the growth step S110 and the slicing and processing step S120 may be repeated a plurality of times (for example, four times or more). This type of growth is referred to as a generational growth in this specification. By performing such a generational growth rather than performing the growth all at once, the c-plane warping is alleviated each time the substrate 50 is cut out, and therefore the internal residual stress in the GaN crystal can be reduced. By reducing the internal residual stress, the difference in the radius of curvature between the grown substrate and the base substrate 10 becomes smaller, which makes it easier to achieve uniform Ge doping. There is no particular upper limit in the number of times that the generational growth is performed, but from the viewpoint of efficiently producing a large-diameter GaN single crystal substrate, it is preferable to perform 10 times or less, for example.

Through the above steps, the substrate 50 according to this embodiment is produced.

(Fabrication Step of a Semiconductor Stack and a Fabrication Step of a Semiconductor Device)

After the substrate 50 is produced, for example, a semiconductor functional layer composed of a group III nitride semiconductor may be epitaxially grown on the substrate 50 to fabricate a semiconductor stack. After the semiconductor stack is fabricated, electrodes, etc., are formed on the semiconductor stack, and the semiconductor stack is diced to cut out chips of a predetermined size. In this way, a semiconductor device may be fabricated. The substrate 50 is highly and uniformly doped with Ge, making it suitable for fabricating vertical devices, etc.

(2) Gallium Nitride Single Crystal Substrate (Free-Standing Nitride Semiconductor Substrate, Nitride Crystal Substrate)

Next, the gallium nitride single crystal substrate 50 according to this embodiment will be described.

In this embodiment, the substrate 50 obtained by the above-described producing method is a free-standing substrate composed of a single crystal GaN.

The diameter of the substrate 50 is, for example, 50 mm or more, and the thickness of the substrate 50 is, for example, 300 μm or more and 1 mm or less.

The substrate 50 is an n-type doped with Ge, and the Ge concentration in the substrate 50 is, for example, $3 \times 10^{18}$ cm$^{-3}$ or more and $1.0 \times 10^{20}$ cm$^{-3}$ or less, preferably $5 \times 10^{18}$ cm$^{-3}$ or more and $1.0 \times 10^{20}$ cm$^{-3}$ or less, and more preferably $1 \times 10^{19}$ cm$^{-3}$ or more and $1.0 \times 10^{20}$ cm$^{-3}$ or less. As the Ge concentration in the substrate 50 increases, the variation in the Ge concentration in the substrate 50 increases, and therefore the peak of the smallest etch pit in the etch pit histogram is more likely to have a shoulder. Therefore, the more highly Ge-doped the substrate is, the more effective it is to perform intermittent etching frequently during Ge-doped growth.

The substrate 50 has, for example, a main surface 50s which serves as an epitaxial growth plane. In this embodiment, a low-index crystal plane closest to the main surface 50s is, for example, a c-plane 50c.

The main surface 50s of the substrate 50 is, for example, mirror-finished, and the root-mean-square roughness RMS of the main surface 50s of the substrate 50 is, for example, less than 1 nm.

Further, in this embodiment, the impurity concentration in the substrate 50 obtained by the above-described producing method is lower than that in a substrate obtained by liquid phase growth such as the flux method or ammonothermal method.

Specifically, the hydrogen concentration in the substrate 50 is, for example, less than $1 \times 10^{17}$ cm$^{-3}$, and preferably $5 \times 10^{16}$ cm$^{-3}$ or less. Further, the oxygen concentration in the substrate 50 is, for example, $5 \times 10^{16}$ cm$^{-3}$ or less, and preferably $3 \times 10^{16}$ cm$^{-3}$ or less.

(Curving of the c-Plane and Variation in the Off-Angle)

The radius of curvature of the c-plane 50c of the substrate 50 is larger than, for example, the radius of curvature of the c-plane 10c of the base substrate 10. Specifically, the radius of curvature of the c-plane 50c of the substrate 50 is, for example, preferably 10 m or more, and more preferably 20 m or more.

In this embodiment, the upper limit of the radius of curvature of the c-plane 50c of the substrate 50 is not particularly limited, and is preferably as large as possible. When the c-plane 50c of the substrate 50 is substantially flat, the radius of curvature of the c-plane 50c may be considered to be infinite.

Further, in this embodiment, the large radius of curvature of the c-plane 50c of the substrate 50 allows the variation in the off-angle θ of the c-axis relative to the normal on main surface 50s of the substrate 50 to be smaller than the variation in the off-angle of the c-axis of base substrate 10.

Specifically, when an X-ray rocking curve measurement was performed for (0002) of the substrate 50 and the off-angle θ of the c-axis with respect to the normal on the main surface 50s was measured based on a diffraction peak angle of the (0002), the variation calculated from the maximum and minimum difference in the size of the off-angle θ within a diameter of 25 mm from the center of the main surface 50s is, for example, 0.14° or less, preferably 0.07° or less, and further preferably 0.05° or less.

In this embodiment, the lower limit of the variation in the off-angle θ of the c-axis of the substrate 50 is not particularly limited, and the smaller the better. When the c-plane 50c of the substrate 50 is substantially flat, the variation in the off-angle θ of the c-axis of the substrate 50 may be considered to be 0°.

Further, in this embodiment, since the curvature of the c-plane 50c is isotropically small with respect to the main surface 50s of the substrate 50, the radius of curvature of the c-plane 50c has little directional dependency.

Specifically, the difference between the radius of curvature of the c-plane 50c in the direction along the a-axis, as determined by the above-described measurement method, and the radius of curvature of the c-plane 50c in the direction along the m-axis, is, for example, 50% or less, and preferably 20% or less, of the larger of these radii of curvature.

(Dislocation Density)

In this embodiment, the dislocation density on the surface of substrate 50 is lower than the dislocation density on the main surface 10s of base substrate 10.

When the substrate 50 is produced using the base substrate 10 composed of high-purity GaN single crystal fabricated by the VAS method, the substrate 50 contains few non-radiative centers caused by foreign matters or point defects. Accordingly, when the main surface of the substrate 50 of the present application is observed using a multiphoton excitation microscope, etc., 95% or more (preferably 99% or more) of dark spots correspond to dislocations rather than non-radiative centers caused by foreign matters or point defects. The "multiphoton excitation microscope" is sometimes called a two-photon excitation microscope.

In this embodiment, since the crystal growth proceeds so as to maintain the flatness of the crystal growth interface, a mechanism of locally concentrating the propagating dislocations does not work. Accordingly, there are no regions having particularly high dislocation density caused by concentration of dislocations, and the distribution of dislocation density is uniform in the plane of the substrate. It is confirmed that unlike Si, Ge does not increase the dislocation density in GaN crystal even when doped at a high concentration.

(Etch Pit Histogram)

Figure 3:
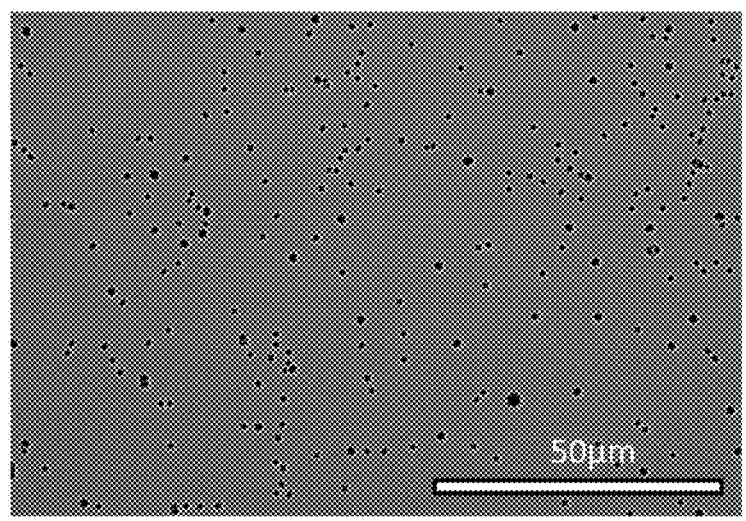
FIG. 3 is an SEM image illustrating an example of etch pits formed on the main surface of the gallium nitride single crystal substrate according to one embodiment of the present invention.

When the main surface 50s of the substrate 50 is etched with an alkaline etching solution, etch pits as illustrated in FIG. 3 are formed. In this embodiment, the substrate 50 was immersed for 15 minutes in a molten liquid (temperature 470° C.) of a 1:1 mixture of potassium hydroxide (KOH) and sodium hydroxide (NaOH) to perform etching. Then, the main surface 50s of the substrate 50 after etching was observed using an SEM, and the diameter of each etch pit was calculated by image analysis. A histogram of etch pit diameters was created from the obtained data on the etch pit diameters. The etch pit diameter may be the maximum diameter of each etch pit obtained by image analysis, or may be an equivalent circle diameter. In this embodiment, the diameter of the smallest peak (hereinafter also referred to as a first peak) among the peaks appearing in the histogram of etch pit diameters was standardized as a, and the horizontal axis was divided into classes in increments of 0.1 a. The vertical axis indicates the number (frequency) of the etch pits in a measurement area.

The average density (number per unit area) of the etch pits formed during etching applied to the main surface 50s of the substrate 50 of this embodiment under the above-described conditions, nearly matches the dislocation density determined by observation using the multiphoton excitation microscope. The size of the etch pits can be changed by adjusting etching conditions, but if they are present at too high a density, adjacent etch pits will overlap, making it difficult to measure the diameter of the etch pits, and therefore in order to perform a meaningful measurement, the average density of the etch pits is preferably less than $1 \times 10^6$ $cm^{-2}$, more preferably less than $5.5 \times 10^5$ $cm^{-2}$, and even more preferably $3 \times 10^5$ $cm^{-2}$ or less. The histograms of the average density of the etch pits and the diameters of the etch pits are preferably measured from a region having an area of 1 $mm^2$ or more.

Here, in the case of the substrate having Ge clusters, etc., on the dislocation core, the peak (particularly the first peak) in the histogram has a shoulder or become a double peak. In contrast, in the histogram of etch pit diameters of the substrate 50 of this embodiment, the first peak is a single peak without a shoulder. That is, the substrate 50 of this embodiment can be said to be a substrate uniformly doped with Ge.

In this specification, the first peak being a single peak without a shoulder means that, for example, when the diameter of the first peak is a, there is no peak other than the first peak in the range of 0.8 a or more and 1.2 a or less, and when a peak width at a height of ⅒ of the peak height from the baseline of the first peak is W and the width of a rising side of the peak obtained by dividing the peak width W into two by a perpendicular line drawn from the peak top to the horizontal axis is f, symmetry coefficient S defined by the following formula (1) is 0.8 or more and 1.2 or less.

$$S = W/(2 \times f) \quad (1)$$

In the substrate 50 of this embodiment, when the frequency of the first peak is A, it is preferable that the number of peaks having a frequency of A/10 or more appearing in the histogram of diameters, including the first peak, is two. It can be said that the number of peaks appearing in the histogram of etch pits corresponds to the number of constituent types of dislocation defects corresponding to the etch pits. Crystals in which many peaks are observed are not only characterized by simple edge or mixed dislocations, but also by a wide variety of impurities and point defects that are in combination with these dislocations. That is, these crystals are likely to have many impurity levels and defect levels, and therefore there are many variations in the properties of the devices fabricated from these crystals, in other words, these crystals are highly likely to result in poor device yields. In contrast, crystals having two peaks, including the first peak, having a frequency of A/10 or more in the histogram, suggest that there are only two types of dislocations in the crystals: simple edge dislocations and mixed dislocations. That is, there are few variations in the properties of the devices fabricated from these crystals, that is, these crystals are highly likely to result in high device yields.

In the substrate 50 of this embodiment, it is preferable that the first peak in all of the plurality of histograms is a single peak without a shoulder, in a histogram of diameters in a plurality of different regions (for example, three or more different regions, more preferably five or more different regions) on the main surface 50s. In all of the histograms, the first peak is a single peak without a shoulder, which indicates that uniform Ge doping is achieved not only in a microscopic region but also at any location in the plane.

In the substrate 50 of this embodiment, the total number of etch pits having a diameter exceeding 4 a is preferably 1/1000 or less of the number of etch pits constituting the first peak. This can be said to mean that there are substantially no etch pits having a diameter exceeding 4 a, but since large etch pits may be formed due to scratches or foreign matters on the substrate 50, the total number of etch pits having a diameter exceeding 4 a is expressed as 1/1000 or less. The substrate 50 of this embodiment is produced by the above-described method without causing dislocations to accumulate. Accordingly, a large number of dislocations are not combined into one, and therefore it can be said that there are substantially no dislocations that have accumulated large strains that deteriorate device properties.

In the substrate 50 of this embodiment, the total number of etch pits having a diameter of 2 a or more is preferably 1/10 or less, and more preferably 1/100 or less, of the number of etch pits constituting the first peak. An etch pit having a diameter of 2 a or more may correspond to a dislocation that may affect the device properties of the substrate 50. Therefore, by setting the total number of etch pits having a diameter of 2 a or more to 1/10 or less (more preferably 1/100 or less) of the number of etch pits constituting the first peak, the properties of the device fabricated on the substrate 50 can be further improved.

In the substrate 50 of this embodiment, the number of etch pits constituting the first peak is preferably 50% or more (more preferably 70% or more) of the total. In this embodiment, as described above, combining of dislocations is unlikely to occur, and no Ge clusters or precipitates are generated. Therefore, there is a high percentage of dislocations having small strain fields. Since the dislocations having small strain fields do not significantly affect the device properties of the substrate 50, the above matter that the first peak is a single peak without a shoulder and that the proportion of etch pits that constitute the first peak is high, means that the properties of the device fabricated on the substrate 50 are good.

Further, the substrate 50 of this embodiment has a second peak in the diameter range more than a and less than 2 a, and the number β of etch pits constituting the second peak is preferably smaller than the number α of etch pits constituting the first peak. The above matter that the diameter of the etch pit constituting the second peak is in the range of more than a and less than 2 a, means that it is highly likely that it corresponds to a simple mixed dislocation, and on the assumption that the first peak is a single peak without a shoulder, the small number of etch pits constituting the second peak, in other words, the large number of etch pits constituting the first peak, indicates that the dislocations in the crystal are mainly composed of dislocations with little strain around the dislocation core. These characteristics mean that the properties of the device fabricated on the substrate 50 are good.

<Other Embodiments>

The embodiment of the present invention has been specifically described above. However, the present invention is not limited to the above embodiment, and various modifications can be made without departing from the spirit and scope of the present invention.

The above-described embodiment shows a case where in the growth step S110, the growth layer 30 is epitaxially grown using the c-plane 30c as a growth plane, but for example, in the middle of the growth step S110, a growth step using an inclined interface other than the c-plane as a growth plane, may be interposed. This allows dislocations to bend, propagate, meet, and annihilate more easily. However, during growth on the inclined interface as a growth plane, Ge is likely to become non-uniform, and therefore it is preferable that during the growth on the inclined interface, Ge doping at a high concentration is not performed, and the growth interface is returned to a flat surface with the c-plane 30c as a growth plane, and then the growth layer 30 grows with Ge doping at a high concentration while performing intermittent etching, and the substrate 50 is obtained from a crystalline region where the intermittent etching has been performed.

The above embodiment shows a case where the growth layer 30 is sliced using a wire saw in the slicing and machining step S120, but for example, an outer circumferential blade slicer, an inner circumferential blade slicer, an electric discharge machine, etc., may also be used.

EXAMPLE

Next, examples of the present invention will be described. These examples are merely examples of the present invention, and the present invention is not limited to these examples.

(1) Fabrication of a Gallium Nitride Single Crystal Substrate

Gallium nitride single crystal substrates of examples 1 to 3 and comparative examples 1 to 3 were fabricated as follows.

[Fabrication Conditions for the Gallium Nitride Single Crystal Substrate in Example 1]

(Base Substrate)
  Material: GaN
  Fabrication method: VAS method
  Diameter: 2 inches
  Thickness: 400 μm
  Low-index crystal plane closest to the main surface: c-plane
  No pattern machining for the mask layer, etc., on the main surface.
  Root mean square roughness RMS of the main surface: 2 nm
  Off-angle on the main surface: 0.4° in the m direction
(growth layer)
  Material: GaN
  Growth method: HVPE method
  Growth temperature: 980° C. to 1,020° C.
  V/III ratio: 2 or more and 20 or less
  Ge doping method: GeCl$_4$ gas
  Partial pressure of GeCl$_4$ gas: 0.35 Pa
  Thickness of the growth layer: 4500 μm (intermittent etching condition)
  Etching gas: HCl gas
  Etching interval: 10 min/cycle
  Etching time: 0.5 min/cycle (slicing and processing condition)
  Thickness of the gallium nitride single crystal substrate: 400 μm
  Kerf loss: 200 μm The substrate 50 was fabricated under the above-described fabrication conditions. Measurement by secondary ion mass spectrometry (SIMS) revealed that the Ge concentration in the substrate 50 was $3\times10^{18}$ cm$^{-3}$.

[Fabrication Conditions for the Gallium Nitride Single Crystal Substrate in Example 2]
  (Base substrate) same as in example 1.
  (Growth layer) in order to increase the Ge concentration more than in example 1, the partial pressure of the GeCl$_4$ gas and the intermittent etching condition were changed to perform growth. The conditions other than those below were the same as in example 1.
  Partial pressure of GeCl$_4$ gas: 1.2 Pa (intermittent etching condition)
  Etching interval: 7 minutes/time
  Etching time: 1 minute/time (slicing and processing condition) same as in example 1.

The substrate 50 was fabricated under the above-described production conditions. Measurement by secondary ion mass spectrometry revealed that the Ge concentration in the substrate 50 was $1\times10^{19}$ cm$^{-3}$.

[Fabrication Conditions for the Gallium Nitride Single Crystal Substrate in Example 3]
  (Base substrate) same as in example 1.
  (Growth layer) in order to increase the Ge concentration even more than in example 2, the partial pressure of the GeCl$_4$ gas and the intermittent etching conditions were changed to perform growth. The conditions other than those described below were the same as in example 1.
  Partial pressure or the GeCl$_4$ gas: 12 Pa (intermittent etching condition)
  Etching interval: 5 minutes/time
  Etching time: 1 minute/time (slicing and processing condition) same as in example 1.

The substrate 50 was fabricated under the above-described fabrication conditions. Measurement by the secondary ion mass spectrometry revealed that the Ge concentration in the substrate 50 was $1\times10^{20}$ cm$^{-3}$.

[Fabrication Conditions for the Gallium Nitride Single Crystal Substrate in Comparative Example 1]
  (Base substrate) same as in example 1.
  (Growth layer) same as in example 1.
  (Intermittent etching) in comparative example 1, intermittent etching was not performed.
  (Slicing and processing condition) same as in example 1.

The substrate 50 was fabricated under the above fabrication conditions. Measurement by the secondary ion mass spectrometry revealed that the Ge concentration in the substrate 50 was $3\times10^{18}$ cm$^{-3}$.

[Fabrication Conditions for the Gallium Nitride Single Crystal Substrate in Comparative Example 2]
  (Base substrate) same as in example 1.
  (Growth layer) same as in example 2.

(Intermittent Etching) in comparative example 2, intermittent etching was not performed.
(Slicing and processing condition) same as in example 1.
The substrate 50 was fabricated under the above-described fabrication conditions. Measurement by the secondary ion mass spectrometry revealed that the Ge concentration in the substrate 50 was $1\times10^{19}$ cm$^{-3}$.

[Fabrication Conditions for the Gallium Nitride Single Crystal Substrate in Comparative Example 3]
(Base substrate) same as in example 1.
(Growth layer) same as in example 3.
(Intermittent Etching) in comparative example 3, intermittent etching was not performed.
(Slicing and processing conditions) same as in example 1.
The substrate 50 was fabricated under the above-described fabrication conditions. Measurement by the secondary ion mass spectrometry revealed that the Ge concentration in the substrate 50 was $1\times10^{20}$ cm$^{-3}$.

(2) Evaluation of the Etch Pit Histogram

The main surfaces of the gallium nitride single crystal substrates of examples 1 to 3 and comparative examples 1 to 3 were etched with an alkaline etching solution under the following conditions to form etch pits.

Etching solution: Alkaline melt consisting of 500 g KOH and 500 g NaOH
Melting temperature: 470° C.
Immersion time: 15 minutes The main surface of the substrate formed with etch pits was observed using a SEM (SU5000, manufactured by Hitachi High-Technologies Corporation). A measurement field was 127 μm×95.3 μm (magnification 1000 times), and etch pits were measured by image analysis for an image (1143 μm×1048 μm) obtained by combining 9 horizontal×11 vertical (total of 99) SEM images. Specifically, using image processing software (Image J), the image was binarized, etch pit areas were filled in, and the larger one of the width and height of the etch pit area was calculated as the diameter of the etch pit. When the etch pit areas were filled in, areas showing small particles and linear pit areas caused by machining scratches, etc., were removed.

From the obtained data on the etch pit diameters, a histogram of etch pit diameters was created. In this example, among the peaks appearing in the histogram of etch pit diameters, the diameter of the peak (first peak) appearing on the smallest diameter side was standardized as 1, and the horizontal axis was divided into classes in increments of 0.1.

Figure 4:
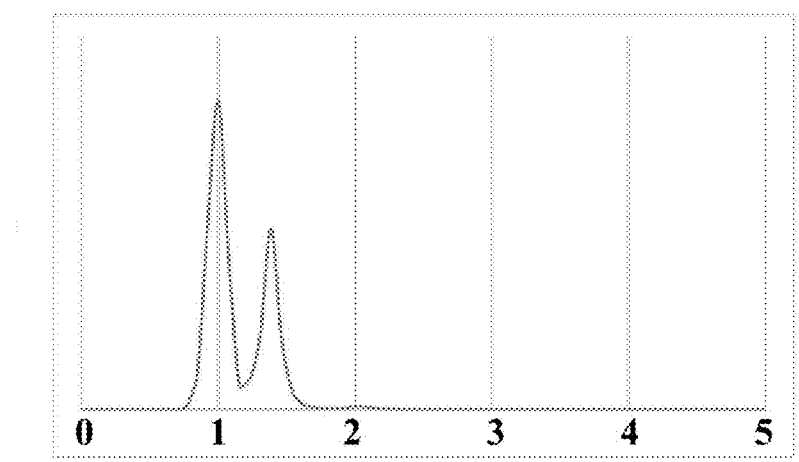
FIG. 4 illustrates histograms of etch pit diameters for the substrate of example 1.
Figure 5:
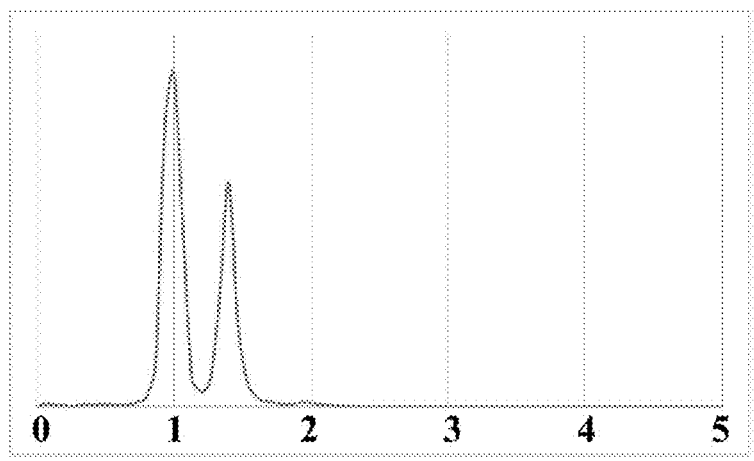
FIG. 5 illustrates histograms of etch pit diameters for the substrate of example 2.
Figure 6:
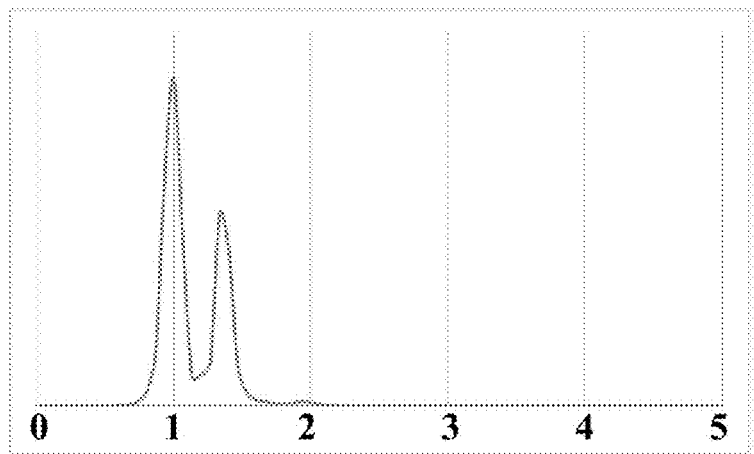
FIG. 6 illustrates histograms of etch pit diameters for the substrate of comparative example 3.
Figure 7:
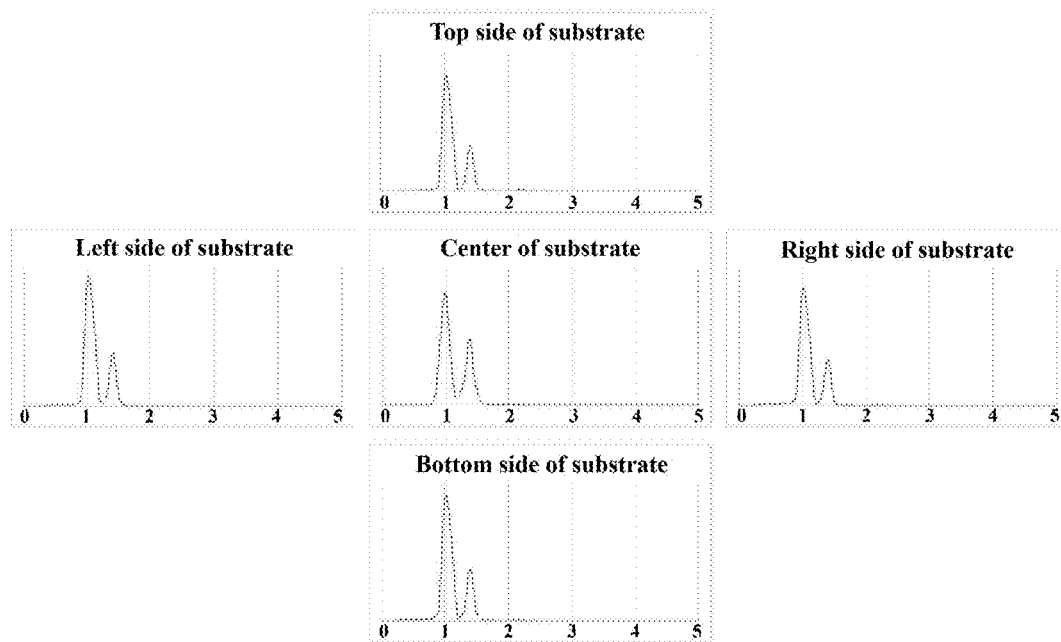
FIG. 7 illustrates a histogram of etch pit diameters at five locations in the plane of the substrate of example 1.
Figure 8:
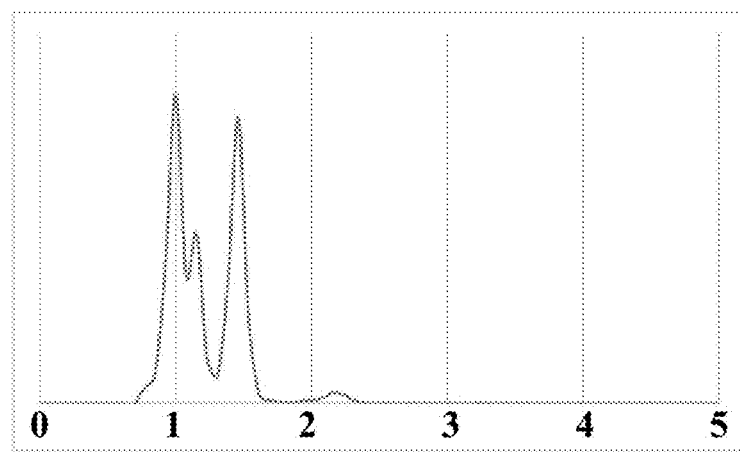
FIG. 8 illustrates a histogram of etch pit diameters for the substrate of comparative example 1.
Figure 9:
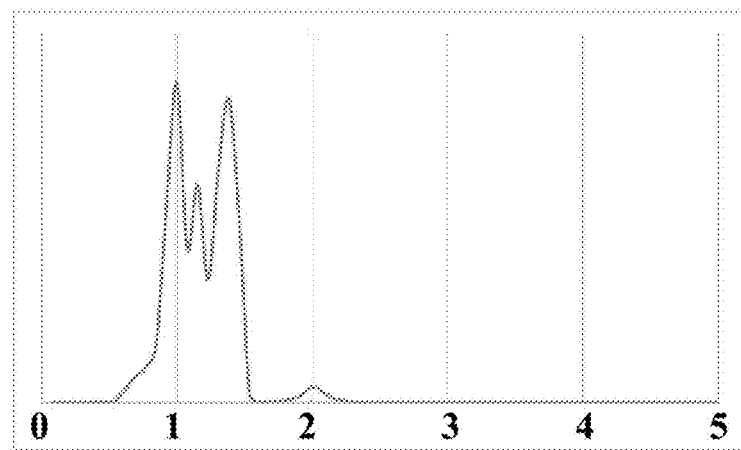
FIG. 9 illustrates a histogram of etch pit diameters for the substrate of comparative example 2.
Figure 10:
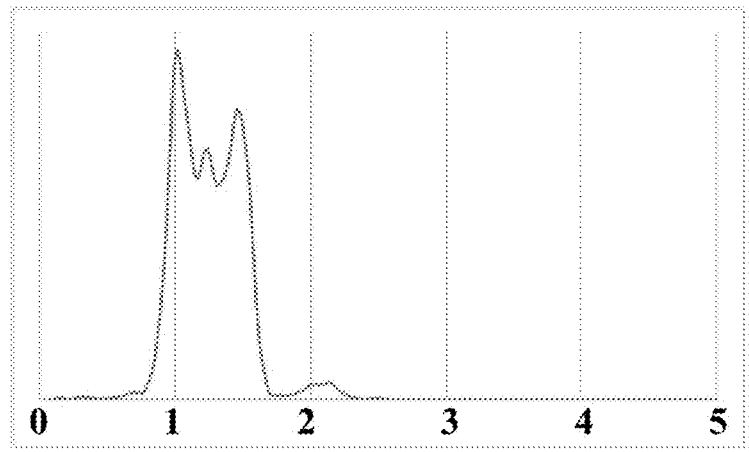
FIG. 10 is a histogram of etch pit diameters for the substrate of comparative example 3.

FIGS. 4 to 6 illustrate histograms measured at the center of the substrates of examples 1 to 3, FIG. 7 illustrates the distribution of histograms measured at five locations in the plane of the substrate of example 1, and FIGS. 8 to 10 illustrate histograms measured at the center of the substrates of comparative examples 1 to 3, respectively. In each histogram, the horizontal axis indicates a normalized etch pit diameter, and the vertical axis indicates the number (frequency) of the etch pits in a measurement area.

As illustrated in FIG. 4, in the substrate of example 1, the first peak of the histogram was a single peak without a shoulder. On the other hand, as illustrated in FIG. 8, in the substrate of comparative example 1, the first peak of the histogram was a double peak.

Further, in the substrates of example 2 (FIG. 5) and example 3 (FIG. 6) in which the Ge concentration was higher than that of the substrate of example 1, the first peak of the histogram also became a single peak without a shoulder. Further, in the substrates of comparative example 2 (FIG. 9) and comparative example 3 (FIG. 10) in which the Ge concentration was higher than that of the substrate of comparative example 1, the first peak of the histogram also became a double peak. It was confirmed that when the Ge concentration was at least $3\times10^{18}$ cm$^{-3}$ or more and growth was performed without intermittent etching, the first peak of the histogram became a double peak.

Further, as illustrated in FIG. 7, in the substrate of example 1, when the histograms were checked at the center of the substrate and five in-plane locations spaced ±20 mm apart from the center in the horizontal and vertical directions, the first peak was a single peak without a shoulder in all histograms.

As described above, by performing intermittent etching during the growth of the growth layer, it was confirmed that the substrate was fabricated showing a histogram in which the first peak is a single peak without a shoulder. Such a substrate can be said to be uniformly doped with Ge at a high concentration, and is therefore suitable for the fabrication of vertical devices, etc.

PREFERABLE ASPECT OF THE PRESENT INVENTION

Preferable aspects of the present invention will be described below.

(Supplementary Description 1)
A gallium nitride single crystal substrate,
which is a gallium nitride single crystal substrate having a diameter of 50 mm or more, with a low-index crystal plane closest to a main surface being (0001), and
in which Ge concentration in the substrate is $3\times10^{18}$ cm$^{-3}$ or more; and
among peaks appearing in a histogram of diameters of etch pits during etching applied to the main surface with an alkaline etching solution, a first peak having a smallest diameter is a single peak having no shoulder.

(Supplementary Description 2)
The gallium nitride single crystal substrate according to supplementary description 1, wherein in the histogram of etch pit diameters, when a diameter of the first peak is a, there is no peak other than the first peak in a range of 0.8 a or more and 1.2 a or less, and when a peak width at a height of ¹⁄₁₀ of a peak height from a baseline of the first peak is W, and when a width of a rising side of the peak is f when dividing the peak width of W into two by a perpendicular line drawn from a peak top to a horizontal axis, symmetry coefficient S defined by the following formula (1) is 0.8 or more and 1.2 or less.

$$S = W/(2 \times f) \qquad (1)$$

(Supplementary Description 3)
The gallium nitride single crystal substrate according to supplementary description 1, wherein when a frequency of the first peak is A, there are two peaks appearing in the histogram having a frequency of A/10 or more, including the first peak.

(Supplementary Description 4)
The gallium nitride single crystal substrate of according to supplementary description 1, wherein in histograms in a plurality of different regions on the main surface, the first peak is a single peak without a shoulder in all of the plurality of histograms.

(Supplementary Description 5)
The gallium nitride single crystal substrate according to supplementary description 1, wherein, when an etch pit diameter of the first peak is a, in the histogram, the total number of etch pits having a diameter exceeding 4 a is 1/1000 or less of the number of the etch pits constituting the first peak.

(Supplementary Description 6)

The gallium nitride single crystal substrate according to supplementary description 1, wherein in the histogram of etch pit diameters, the total number of etch pits having a diameter of 2 a or more is 1/10 or less, more preferably 1/100 or less, of the number of etch pits constituting the first peak.

(Supplementary Description 7)

The gallium nitride single crystal substrate according to supplementary description 1, wherein in the histogram of etch pit diameters, the number of etch pits constituting the first peak is 50% or more, and more preferably 70% or more of the total.

(Supplementary Description 8)

The gallium nitride single crystal substrate according to supplementary description 1, wherein in the histogram of etch pit diameters, a second peak is present in a range of diameters more than a and less than 2 a, and the number β of etch pits constituting the second peak is smaller than the number α of etch pits constituting the first peak.

(Supplementary Description 9)

The gallium nitride single crystal substrate according to supplementary description 1, wherein an average density of the etch pits is less than $1\times10^6$ cm$^{-2}$.

(Supplementary Description 10)

The gallium nitride single crystal substrate according to supplementary description 1, wherein the histogram is measured from a region having an area of 1 mm$^2$ or more.

(Supplementary Description 11)

A method for producing a gallium nitride single crystal substrate, the method including the steps of:
(a) preparing a base substrate composed of a gallium nitride single crystal having (0001) that is a low-index crystal plane closest to a main surface;
(b) epitaxially growing the gallium nitride single crystal having a Ge concentration of $3\times10^{18}$ cm$^{-3}$ or more on the main surface of the base substrate; and
(c) obtaining a gallium nitride single crystal substrate having a diameter of 50 mm or more, from the gallium nitride single crystal epitaxially grown in the step (b), wherein in the step (b), a gas containing HCl is intermittently introduced to periodically etch a growth interface, thereby uniformly doping the crystal with Ge.

What is claimed is:

1. A gallium nitride single crystal substrate, which is a gallium nitride single crystal substrate having a diameter of 50 mm or more, with a low-index crystal plane closest to a main surface being (0001), and in which Ge concentration in the substrate is $3\times10^{18}$ cm$^{-3}$ or more; and
among peaks appearing in a histogram of diameters of etch pits during etching applied to the main surface with an alkaline etching solution, a first peak having a smallest diameter is a single peak having no shoulder.

2. The gallium nitride single crystal substrate according to claim 1, wherein when a frequency of the first peak is A, there are two peaks appearing in the histogram having a frequency of A/10 or more, including the first peak.

3. The gallium nitride single crystal substrate of according to claim 1, wherein in histograms in a plurality of different regions on the main surface, the first peak is a single peak without a shoulder in all of the plurality of histograms.

4. The gallium nitride single crystal substrate according to claim 1, wherein, when an etch pit diameter of the first peak is a, in the histogram, the total number of etch pits having a diameter exceeding 4 a is 1/1000 or less of the number of the etch pits constituting the first peak.

5. The gallium nitride single crystal substrate according to claim 1, wherein an average density of the etch pits is less than $1\times10^6$ cm$^{-2}$.

6. The gallium nitride single crystal substrate according to claim 1, wherein the histogram is measured from a region having an area of 1 mm$^2$ or more.

7. A method for producing a gallium nitride single crystal substrate, the method including the steps of:
(a) preparing a base substrate composed of a gallium nitride single crystal having (0001) that is a low-index crystal plane closest to a main surface;
(b) epitaxially growing the gallium nitride single crystal having a Ge concentration of $3\times10^{18}$ cm$^{-3}$ or more on the main surface of the base substrate; and
(c) obtaining a gallium nitride single crystal substrate having a diameter of 50 mm or more, from the gallium nitride single crystal epitaxially grown in the step (b), wherein in the step (b), a gas containing HCl is intermittently introduced to periodically etch a growth interface, thereby uniformly doping the crystal with Ge.

* * * * *